United States Patent [19]
Ahsanullah

[11] Patent Number: 5,059,823
[45] Date of Patent: Oct. 22, 1991

[54] SUPPLY BOUNCE CONTROLLED OUTPUT BUFFER CIRCUIT

[75] Inventor: Zahid Ahsanullah, Austin, Tex.

[73] Assignee: Advanced Micro Devices, Inc., Sunnyvale, Calif.

[21] Appl. No.: 600,948

[22] Filed: Oct. 22, 1990

[51] Int. Cl.$^5$ ............... H03K 19/003; H03K 19/094; H03K 17/687

[52] U.S. Cl. .................................. 307/443; 307/542; 307/572; 307/451

[58] Field of Search ............. 307/443, 542, 546, 592, 307/594, 572, 579, 585

[56] References Cited

U.S. PATENT DOCUMENTS

| | | | |
|---|---|---|---|
| 4,638,187 | 1/1987 | Boler et al. | 307/443 |
| 4,789,796 | 12/1988 | Foss | 307/270 |
| 4,825,101 | 4/1989 | Walters, Jr. | 307/451 |

*Primary Examiner*—John Zazworsky
*Assistant Examiner*—Scott A. Ouellette
*Attorney, Agent, or Firm*—Davis Chin

[57] ABSTRACT

A supply bounce controlled output buffer circuit for producing an output signal at an output terminal pin with a significant reduction in inductive ringing includes an output stage, a first delay network (38), and a second delay network (42). The output stage includes a series-connected pull-up transistor (P1) and pull-down transistor (N1) coupled between a first power supply terminal pin and a second power supply terminal pin. The common connection of the pull-up and pull-down transistors (P1, N1) are coupled to an output terminal pin. The first delay network (38) is interconnected between the first power supply terminal pin and a control electrode of the pull-up transistor (P1) for turning off the pull-up transistor (N1) so as to slow down the rate of rise of the output signal for a portion of the time when the output terminal pin is making a low-to-high transition so as to reduce the overshoot. The second delay network (42) is interconnected between the second power supply terminal pin and a control electrode of the pull-down transistor (N1) for turning off the pull-down transistor (N1) so as to slow down the rate of fall of the output signal for a portion of the time when the output terminal pin is making a high-to-low transition so as to reduce the undershoot.

13 Claims, 2 Drawing Sheets

SUPPLY BOUNCE CONTROLLED OUTPUT BUFFER CIRCUIT

BACKGROUND OF THE INVENTION

This invention relates generally to high-speed output driving circuits and more particularly, it relates to a supply bounce controlled output buffer circuit in integrated circuits which has a significant reduction in inductive ringing.

As is well-known in the art, digital logic circuits are widely used in the areas of electronics and computer-type equipment. Specifically, one such use of digital logic circuits is to provide an interface function between one logic type of a first integrated circuit device and another logic type of a second integrated circuit device. An output buffer circuit is an important component for this interface function. The output buffer circuit provides, when enabled, an output signal which is a function of a data input signal received from other logic circuitry of the integrated circuit.

In FIG. 1, there is shown a simplified schematic circuit diagram of a portion of a typical output buffer circuit 10 which is formed as part of a semiconductor integrated circuit chip 12. The output buffer circuit 10 includes a pull-up transistor device 14 and a pull-down transistor device 16 connected in series between respective first and second power supply terminal pins 18, 20. The first power supply terminal pin 18 may be supplied with a positive potential or voltage VCC (typically at +5.0 volts) which is connected to an internal power supply potential node VL2 via a lead line having parasitic inductance L2. The source of the P-channel field-effect transistor 14 is also connected to the node VL2. The parasitic inductance L2 represents a package inductance associated with the terminal pin 18 itself and the bond wire used to connect the source of the transistor 14 to the terminal pin 18. The second power supply terminal pin 20 may be supplied with a ground potential VSS (typically at 0 volts) which is connected to an internal ground potential node VL1 via a lead line having parasitic inductance L1. The source of the N-channel field-effect transistor 16 is also connected to the node VL1. The parasitic inductance L1 represents a package inductance associated with the terminal pin 20 itself and the bond wire used to connect the source of the transistor 16 to the terminal pin 20.

The drains of the transistors 14 and 16 are connected together and are further joined to an internal node 22. The internal node 22 is also connected to an output terminal pin 24 via a lead connection having parasitic inductance L3. The parasitic inductance L3 represents a package inductance associated with the output terminal pin 24 itself and the bond wire used to connect the drains of the transistors 14, 16 to the terminal pin 24. The output of the terminal pin 24 of the buffer circuit 10 is used to drive a capacitive load represented by capacitor CAP and connected between the terminal pin 24 and the ground potential VSS. The capacitor CAP defines the load that the output terminal pin sees and is the sum of individual capacitances of all the devices being driven as well as the board capacitance.

Dependent upon the logic state of the data input signal and an enable signal, either the pull-up transistor 14 or the pull-down transistor 16 is quickly turned OFF and the other one of them is turned ON. Such rapid switching OFF and ON of the pull-up and pull-down transistor devices causes sudden surges of current creating what is commonly known as current spikes. As a result, when the internal output node 22 is making a high-to-low transition, oscillation or inductive ringing appears at the output terminal 24 referred to as "ground bounce." This "ground bounce" is defined to be undershooting of the ground potential followed by a dampening oscillation around it. This is a major problem in highspeed output buffer circuits. The higher the value of the inductance and the lower the value of the capacitance, the more severe will be the "ground bounce."

Also, during such output switching, charging and discharging currents from the pull-up and pull-down transistor devices will flow through the package inductances of the power supply and ground lines so as to cause inductive noises at the internal power supply potential node VL2 and at the internal ground potential node VL1. These internal supply and ground noises are undesirable since they will degrade the output voltage levels (logic "1" and logic "0") causing interface problems among the output buffer circuit and other integrated circuits.

Referring again to FIG. 1, assume initially that the output terminal pin 24 is at a positive voltage or logic "1" level. In order to have a high-to-low transition occur at the output terminal pin 24, the pullup transistor 14 is turned off and the pull-down transistor 16 is turned on. As a result, as the pull-down transistor 16 begins to conduct, the voltage at the internal ground potential node VL1 will jump up momentarily from the ground potential due to a higher voltage connected to it from the output terminal pin 24. This will, in turn, cause the pull-down transistor 16 to lose momentarily some of its driving power thereby slowing down the rate of the transition at the output terminal pin 24. When the inductor finally does change state, this voltage at the node VL1 will then go down and the transistor 16 will start pulling down the output pin 24 at a high transition rate again. The harder (faster) the transistor 16 turns on, the voltage jump at the node VL1 will be more exaggerated or severe. For example, a best case process corner (fast) transistor will turn on and pull down faster than a worst case process corner (slow) transistor.

While the pull-down transistor 16 will begin to turn off as the voltage at the output terminal 24 approaches ground (0 volts), the potential energy developed in the inductive and capacitive components (L3 and CAP) will cause this voltage to undershoot the ground potential. Consequently, the pull-down transistor 16 will be turned on in the reverse direction so as to couple the potential energies in the inductances L3 and L1 in a mutually aiding manner. As a result, the voltage on the output terminal will undershoot even further than it had intended thereby aggravating the ringing. Thus, there will be several oscillations occurring before the voltage at the output terminal 24 reaches the steady-state condition.

Similarly, when the output terminal 24 is making a low-to-high transition inductive ringing will appear at the output terminal and the output voltage will overshoot the positive supply potential. This overshoot is sometimes referred to as "supply bounce."

The present invention utilizes the voltage jump at the internal power supply potential and ground potential nodes VL2 and VL1 to slow down the rate of transition at the output terminal 24, thereby reducing significantly the inductive ringing. This is achieved by the provision of first and second delay networks for turning off the corresponding pull-up or pull-down transistor earlier than it would normally turn off so as to slow down the rate of rise or fall of the output signal for the portion of the time when the output terminal pin is making the corresponding low-to-high or high-to-low transition.

SUMMARY OF THE INVENTION

Accordingly, it is a general object of the present invention to provide a supply bounce controlled output buffer circuit with significant reduction in inductive ringing which is relatively simple and economical to manufacture and assemble, but yet overcomes the disadvantages of the prior art output buffer circuits.

It is an object of the present invention to provide a supply bounce controlled output buffer circuit which has a significant reduction in inductive ringing.

It is another object of the present invention to provide a supply bounce controlled output buffer circuit which includes a first delay network associated with the pull-up transistor and a second delay network associated with the pull-down transistor.

It is still another object of the present invention to provide a supply bounce controlled output buffer circuit which includes first delay means for turning off the pull-up transistor so as to slow down the rate of rise of the output signal and second delay means for turning off the pull-down transistor so as to slow down the rate of fall of the output signal.

In accordance with these aims and objectives, the present invention is concerned with the provision of a supply bounce controlled output buffer circuit for producing an output signal at an output terminal pin which has a significant reduction in inductive ringing. The output buffer circuit includes an output stage, a first delay network, and a second delay network. The output stage includes a series-connected pull-up transistor and pull-down transistor coupled between a first power supply terminal pin and a second power supply terminal pin. The common connection of the pull-up and pull-down transistors are coupled to an output terminal pin.

The first delay network is interconnected between the first power supply terminal pin and a control electrode of pull-up transistor for slowing down the rate of rise of the output signal for a portion of the time when the output terminal pin is making a low-to-high transition so as to reduce the overshoot. The second delay network is interconnected between the second power supply terminal pin and a control electrode of the pull-down transistor for slowing down the rate of fall of the output signal for a portion of the time when the output terminal pin is making the high-to-low transition so as to reduce the undershoot.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
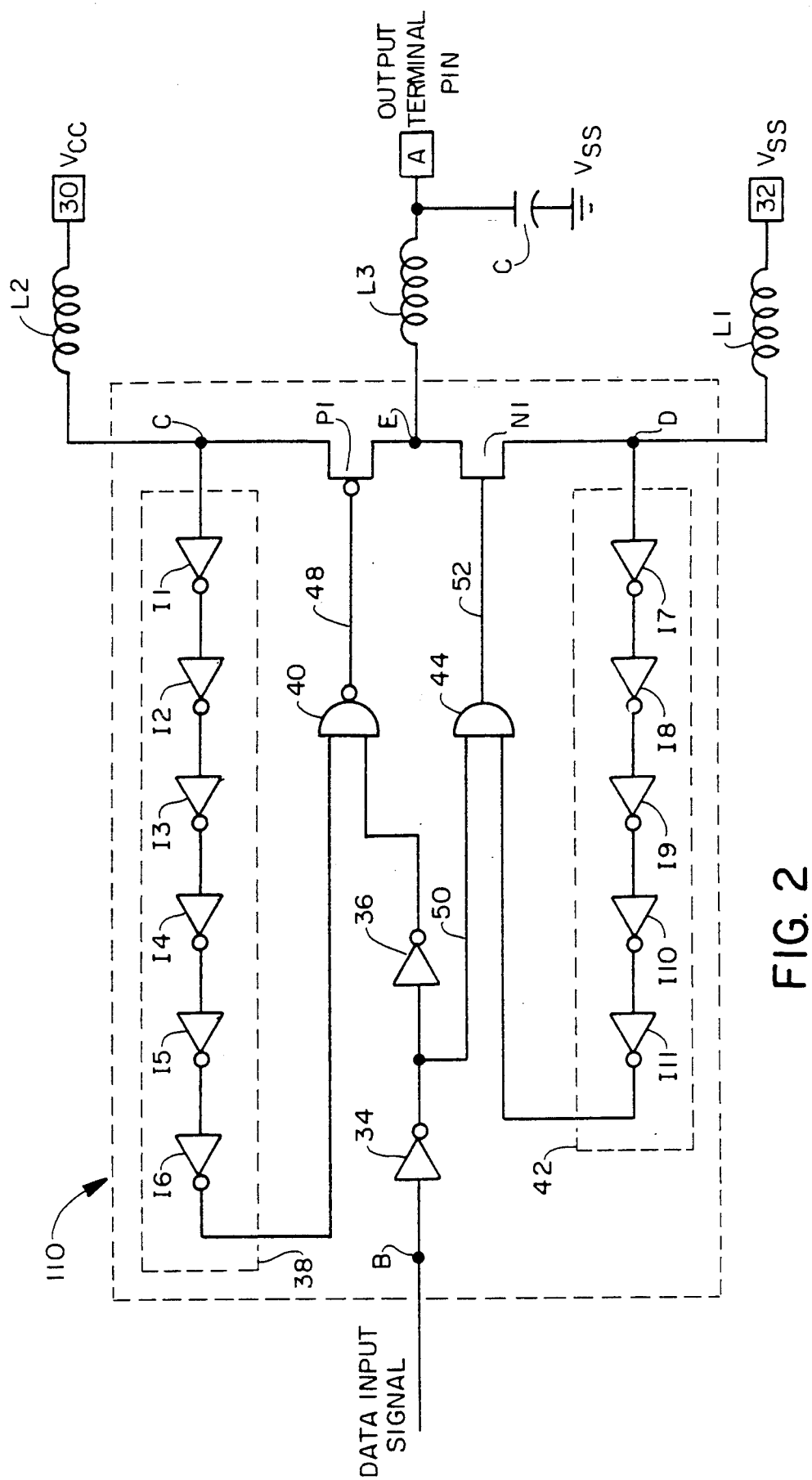
FIG. 2 is a schematic circuit diagram of a supply bounce controlled output buffer circuit, constructed in accordance with the principles of the present invention.

Referring now in detail to the drawings, there is shown in FIG. 2 a schematic circuit diagram of a supply bounce controlled output buffer circuit 110 which is constructed in accordance with the principles of the present invention. The output buffer circuit 110 is formed of a P-channel field-effect pull-up transistor P1 and an N-channel field-effect pull-down transistor N1. The buffer circuit 110 provides the capability of driving quickly output capacitive loads but yet reduces significantly the inductive ringing in the output signal due to the pull-up and pull-down transistors P1 and N1 switching states. The output buffer circuit 110 provides an output signal at an output terminal pin A in response to a data input signal DATA received at data input node B.

The source of the pull-up transistor P1 is connected to an internal power supply potential node C which is coupled to a first power supply terminal pin 30 via a lead line having package inductance L2. The first power supply terminal pin 30 may be supplied with a positive potential or voltage VCC which is typically +5.0 volts. The source of the pull-down transistor N1 is connected to an internal ground potential node D which is coupled to a second power supply terminal pin 32 via a lead line having a package inductance L1. The second power supply terminal pin 32 may be supplied with a ground potential VSS which is typically at 0 volts. The drains of the transistors P1 and N1 are connected together at an internal output node E which is coupled to the output terminal pin A via a lead line having package inductance L3. Further, a capacitive load represented by a capacitor C is connected between the output terminal A and the ground potential VSS.

The output buffer circuit 110 further includes a first inverter 34, a second inverter 36, a first delay network 38, a NAND logic gate 40, a second delay network 42, and an AND logic gate 44. The data input signal DATA received at the node B is inverted twice by the inverters 34 and 36 to produce the data input signal on line 46. This data input signal on the line 46 is fed to a first input of the NAND logic gate 40. The second input of the NAND gate 40 receives a first delayed signal from the output of the first delay network 38. The input of the delay network 38 is connected to the internal power supply potential node C which is tied to the source electrode of the pull-up transistor P1. The output of the NAND logic gate 40 is connected via line 48 to the gate or control electrode of the pull-up transistor P1.

The data input signal DATA received at the node B is inverted by the inverter 34 to produce the inverted data input signal $\overline{DATA0}$ on line 50. This inverted data input signal on the line 50 is fed to a first input of the AND logic gate 44. The second input of the AND gate 44 receives a second delayed signal from the output of the second delay network 42. The input of the delay network 42 is connected to the internal ground potential node D which is tied to the source electrode of pull-down transistor N1. The output of the AND logic gate 44 is connected via line 52 to the gate or control electrode of the pull-down transistor N1.

The first delay network 38 is formed of six series-connected inverters I1, I2, I3, I4, I5 and I6. As can be seen, the input of the inverter I1 defining the input of the delay network 38 is connected to the internal power supply potential node C. The output of the inverter I6 defining the output of the delay network 38 is connected to the second input of the NAND logic gate 40. The second delay network 42 is formed of five series-connected inverters I7, I8, I9, I10 and I11. The input of the inverter I7 defining the input of the second delay network 42 is connected to the internal ground potential node D. The output of the inverter I11 defining the output of the second delay network 42 is connected to the second input of the AND logic gate 44. It should be understood by those skilled in the art that there exists various ways in which to implement the delay networks 38 and 42. Further, the first delay network 38 may consist of any even number of inverters and the second delay network 42 may consist of any odd number of inverters.

Figure 1:
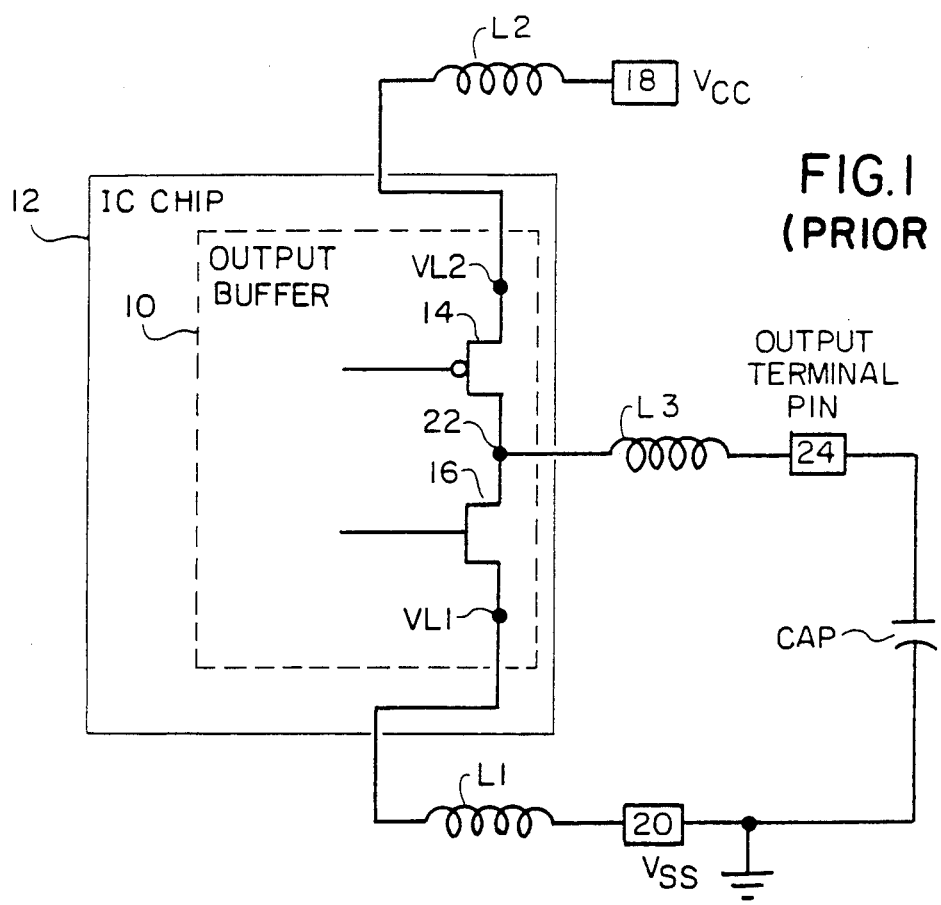
FIG. 1 is a simplified schematic circuit diagram of a portion of a typical output buffer circuit.
Figure 3:
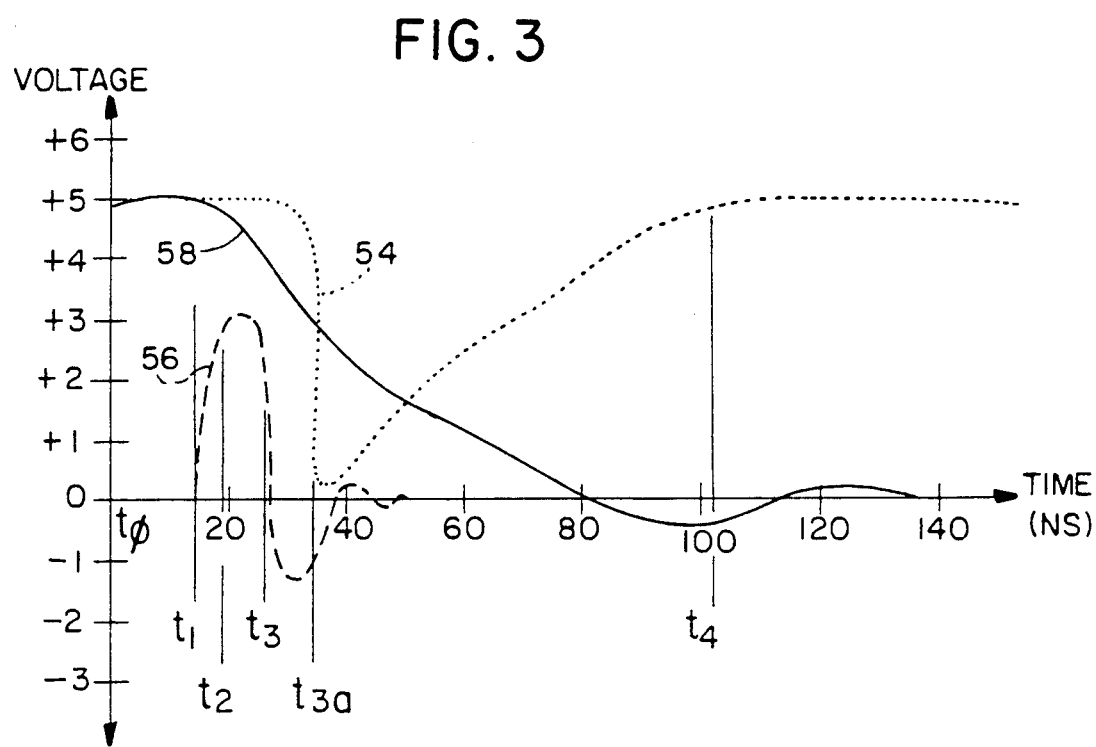
FIG. 3 illustrates the voltages at various points in the output buffer circuit of the present invention in response to a high-to-low transition of the data input signal.

In order to provide an understanding of the operation of the output buffer !10 circuit of the present invention, the pull-down action will now be explained with reference to the waveform diagrams illustrated in FIG. 3. The voltages on the line 52 (gate of transistor N1), internal ground potential node D, and output terminal pin A are shown in FIG. 3 in corresponding waveforms 54, 56 and 58. Initially, it will be assumed that the output signal at the output terminal pin A is at a high or logic "1" level and the data input signal DATA at the node B is at a high or logic "1" level. Thus, the pull-up transistor P1 will be turned on and the pull-down transistor will be turned off.

When the output terminal pin A is to be pulled down to the low or logic "0" level, the data input signal DATA makes a transition. In response to the data input signal DATA making the transition, the pull-up transistor P1 will be turned off quickly since the output of the NAND gate 40 on the line 48 defining a first control signal will go to a high logic level. Thus, the waveform 58 representing the output voltage on the terminal pin A will begin to drop or go low between the times t0 and t1. Further, at the time t1 the pulldown transistor N1 will be turned on since the output (waveform 54) of the AND gate 44 on the line 52 defining a second control signal will go to a high logic level. As a result, a positive pulse (waveform 56) will be generated at the internal ground potential node D between the times t2 and t3. It will be noted that the waveform 58 of the output voltage continues to decrease or drop during this period between the times t2 and t3.

This positive pulse is inverted and delayed by the second delay network 42 and is fed to the second input of the AND gate 44. This will, in turn, cause the second control signal after some delay to go low at the time t3a, thereby turning off the pull-down transistor N1 between the times t3a and t4. Consequently, the waveform 58 of the output voltage continues to decrease towards the low or logic "0" level but at a slower rate of fall. Therefore, the waveform 58 will undershoot the low level by a smaller amount and hence the ground bounce will be controlled. As can be seen, a narrow negative pulse (waveform 54) will be applied between times t3a and t4 to the control electrode of the pull-down transistor N1 so as to prevent it from turning back on again, which reduces the inductive ring that can occur at the output terminal A. Thus, the undershoot will reach the maximum of approximately −0.5 volts at the time t4 rather than a much lower potential.

It should be understood by those skilled in the art that the transition levels of the respective inverters I7 through Il1 and the AND gate 44 can be controlled so as to effect a negative pulse (waveform 54) having a faster fall time and a slower rise time. Further, it will be appreciated that the capability of the transistor N1 to switch faster is dependent upon how well it is fabricated. In other words, the switching characteristics of the transistor N1 is dependent upon process. Therefore, for the same size transistor a best case transistor will be faster than a worst case transistor. Accordingly, the faster the transistor N1 switches the higher, the voltage jump will be at the internal ground potential node D. In the worst case transistor, the voltage jump at the node D may be quite small or negligible and thus the output voltage will be unaffected. Thus, the action of the delay network 42 and the AND gate 44 never comes into play if the switching speed is not very fast. In other words, the delay network and the AND gate is used only for fast switching pull-down transistors.

In view of the foregoing discussion, it should be apparent that the control electrode of the pull-down transistor N1 responds to the delayed signal from the output of the second delay network 42 for turning off the pull-down transistor N1 for the duration of the narrow negative pulse so as to slow down the rate of fall at the output terminal pin A for a portion of the time when the output terminal pin is making the high-to-low transition so as to reduce the ground bounce. In order to effect a pull-up action, the pull-down transistor N1 is turned off and the pull-up transistor Pl is turned on. Similarly, the first delay network 38 and the NAND gate 40 will cause a narrow pulse to be generated so as to turn off the transistor Pl for a portion of the time when the output voltage at the terminal pin A is rising towards the high logic level. Again, the rate of rise of the output voltage will be slowed down so as to reduce the amount of overshoot and thus control the inductive ringing.

From the foregoing detailed description, it can thus be seen that the present invention provides a supply bounce controlled output buffer circuit which is formed of an output stage, a first delay network, and a second delay network. The first and second delay networks serve to turn off the respective pull-up and pull-down transistors so as to slow down the rate of rise or fall of the output signal for a portion of the time when the output terminal pin is making either the low-to-high or high-to-low transition so as to reduce the inductive ringing.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A supply bounce controlled output buffer circuit for producing an output signal at an output terminal pin which has a significant reduction in inductive ringing said output buffer circuit comprising:

a first pull-up transistor (P1) having one of its main electrodes coupled to a first power supply terminal pin and its other main electrode coupled to the output terminal pin;

a pull-down transistor (N1) having one of its main electrodes coupled to a second power supply terminal pin and its other main electrode coupled to the output terminal pin;

a first inverter (34) having its input connected to receive a data input signal and an output;

a second inverter (36) having its input connected to the output of said first inverter (34) and an output;

a NAND logic gate (40) having a first input connected to the output of said second inverter (36) and an output connected to a control electrode of said pull-up transistor (P1);

first delay means (38) having an input connected to said one of its main electrodes of said pull-up transistor (P1) and an output connected to a second input of said NAND logic gate (40);

an AND logic gate (44) having a first input connected to the output of said first inverter (34) and an output connected to a control electrode of said pull-down transistor (N1); and second delay means (42) having an input connected to said other main electrode of said pull-down transistor (N1) and an output connected to a second input of said AND logic gate (44).

2. An output buffer circuit as claimed in claim 1, wherein said pull-up transistor (P1) is a P-channel, field-effect transistor.

3. An output buffer circuit as claimed in claim 2, wherein said pull-down transistor (N1) is an N-channel, field-effect transistor.

4. An output buffer circuit as claimed in claim 1, wherein said first delay means (38) comprises a first delay network formed of six series-connected inverters (I1–I6).

5. An output buffer circuit as claimed in claim 4, wherein said second delay means (42) comprises a second delay network formed of five series-connected inverters (I7–I11).

6. An output buffer circuit as claimed in claim 1, wherein said first delay means (38) comprises any even number of series-connected inverters.

7. An output buffer circuit as claimed in claim 6, wherein said second delay means (42) comprises any odd number of series-connected inverters.

8. An output buffer circuit as claimed in claim 1, wherein said pull-down transistor (N1) is responsive to a delayed signal from said second delay means (42) for turning off said pull-down transistor (N1) so as to slow down the rate of fall of the output signal for a portion of the time when said output terminal pin is making the high-to-low transition so as to reduce the undershoot.

9. An output buffer circuit as claimed in claim 8, wherein said pull-up transistor (P1) is responsive to a second delayed signal from said first delay means (38) for turning off said pull-up transistor (P1) so as to slow down the rate of rise of the output signal for a portion of the time when said output terminal pin is making the low-to-high transition so as to reduce the overshoot.

10. A supply bounce controlled output buffer circuit for producing an output signal at an output terminal pin which has a significant reduction in inductive ringing, said output buffer circuit comprising:

input means responsive to a data input signal for controlling output stage means;

output stage means including a series-connected pull-up transistor (P1) and pull-down transistor (N1) coupled between a first power supply terminal pin and a second power supply terminal pin, the common connection of said pull-up and pull-down transistors (P1,N1) being coupled to an output terminal pin;

first delay means (38) interconnected between said first power supply terminal pin and a control electrode of said pull-up transistor (P1) for slowing down the rat of rise of the output signal for a portion of the time when said output terminal pin is making a low-to-high transition so as to reduce the overshoot;

said first delay means (38) including a first delay network formed of six series-connected inverters (I1–I6); and second delay means (42) interconnected between said second power supply terminal pin and a control electrode of said pull-down transistor (N1) for slowing down the rate of fall of the output signal for a portion of the time when said output terminal pin is making a high-to-low transition so as to reduce the undershoot.

11. An output buffer circuit as claimed in claim 10, wherein said pull-up transistor (P1) is a P-channel, field-effect transistor.

12. An output buffer circuit as claimed in claim 11, wherein said pull-down transistor (N1) is an N-channel, field-effect transistor.

13. An output buffer circuit as claimed in claim 10, wherein said second delay means (42) comprises a second delay network formed of five series-connected inverters (I7–I11).

* * * * *